(12) United States Patent
Cobbley et al.

(10) Patent No.: US 7,755,204 B2
(45) Date of Patent: Jul. 13, 2010

(54) STACKED DIE MODULE INCLUDING MULTIPLE ADHESIVES THAT CURE AT DIFFERENT TEMPERATURES

(75) Inventors: Chad A. Cobbley, Boise, ID (US); Timothy L. Jackson, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 1108 days.

(21) Appl. No.: 10/672,750

(22) Filed: Sep. 25, 2003

(65) Prior Publication Data

US 2004/0056342 A1 Mar. 25, 2004

Related U.S. Application Data

(62) Division of application No. 10/141,447, filed on May 8, 2002, now Pat. No. 6,682,955.

(51) Int. Cl.
*H01L 23/02* (2006.01)
*H01L 29/40* (2006.01)
*H01L 21/00* (2006.01)

(52) U.S. Cl. .............. 257/782; 257/686; 257/777; 257/778; 257/783; 438/108; 438/109

(58) Field of Classification Search ............ 257/783, 257/686, 777, 778, 782; 438/106, 123
See application file for complete search history.

(56) References Cited

U.S. PATENT DOCUMENTS 1,835,350 A    12/1931    Soffel
4,285,433 A    8/1981    Garrett et al.
4,589,547 A    5/1986    Stewart et al.
5,145,099 A    9/1992    Wood et al.
5,477,160 A    12/1995    Love
5,675,180 A    10/1997    Pederson et al.
5,719,440 A *    2/1998    Moden ................ 257/697
5,828,224 A    10/1998    Maruyama
5,891,761 A    4/1999    Vindasius et al.
5,952,725 A    9/1999    Ball
6,064,120 A    5/2000    Cobbley et al. ............ 257/780
6,094,057 A    7/2000    Hiruta et al.

(Continued)

FOREIGN PATENT DOCUMENTS

JP          57015455         1/1982

(Continued)

*Primary Examiner*—Matthew C Landau
*Assistant Examiner*—James M Mitchell
(74) *Attorney, Agent, or Firm*—Fletcher Yoder

(57) ABSTRACT

A technique for forming die stacks. Specifically, a stacking tip is provided to facilitate the stacking of die in a desired configuration. A first die is picked up by the stacking tip. The first die is coated with an adhesive on the underside of the die. The first die is brought in contact with a second die via the stacking tip. The second die is coupled to the first die via the adhesive on the underside of the first die. The second die is coated with an adhesive coating on the underside of the die. The second die is then brought in contact with a third die via the stacking tip. The third die is coupled to the second die via the adhesive on the underside of the second die, and so forth. Die stacks are formed without being coupled to a substrate. The die stacks may be functionally and/or environmentally tested before attaching the die stack to a substrate.

10 Claims, 4 Drawing Sheets

U.S. PATENT DOCUMENTS

| | | | |
|---|---|---|---|
| 6,184,064 B1 | 2/2001 | Jiang et al. | 438/113 |
| 6,188,126 B1 | 2/2001 | Pedersen et al. | |
| 6,204,079 B1 | 3/2001 | Aspar et al. | |
| 6,214,733 B1 | 4/2001 | Sickmiller | |
| 6,258,626 B1 * | 7/2001 | Wang et al. | 438/107 |
| 6,274,389 B1 * | 8/2001 | Iida et al. | 438/4 |
| 6,285,081 B1 | 9/2001 | Jackson | 257/738 |
| 6,292,007 B1 | 9/2001 | Potter | |
| 6,329,220 B1 | 12/2001 | Bolken et al. | 438/106 |
| 6,331,221 B1 | 12/2001 | Cobbley | 156/60 |
| 6,337,225 B1 * | 1/2002 | Foong et al. | 438/106 |
| 6,343,019 B1 | 1/2002 | Jiang et al. | 361/761 |
| 6,353,268 B1 | 3/2002 | Cobbley et al. | 257/796 |
| 6,387,728 B1 * | 5/2002 | Pai et al. | 438/106 |
| 6,400,173 B1 | 6/2002 | Shimizu et al. | |
| 6,474,475 B1 | 11/2002 | Bjork | |
| 6,503,776 B2 * | 1/2003 | Pai et al. | 438/106 |
| 6,512,303 B2 * | 1/2003 | Moden | 257/778 |
| 6,544,864 B2 * | 4/2003 | Reeder et al. | 438/455 |
| 6,562,648 B1 | 5/2003 | Wong et al. | |
| 6,583,032 B1 | 6/2003 | Ishikawa et al. | |
| 6,586,825 B1 * | 7/2003 | Rajagopalan et al. | 257/686 |
| 6,599,764 B1 | 7/2003 | Ang | |
| 6,627,477 B1 * | 9/2003 | Hakey et al. | 438/106 |
| 6,682,955 B2 | 1/2004 | Cobbley et al. | |
| 6,706,557 B2 | 3/2004 | Koopmans | |
| 6,753,205 B2 | 6/2004 | Halahan | |
| 6,774,475 B2 | 8/2004 | Blackshear et al. | |
| 6,777,924 B2 | 8/2004 | Flach et al. | |
| 6,847,105 B2 | 1/2005 | Koopmans | |
| 6,869,826 B2 | 3/2005 | Wark | |
| 6,943,050 B2 | 9/2005 | Kondo | |
| 6,959,863 B2 | 11/2005 | Figuet et al. | |
| 6,989,285 B2 | 1/2006 | Ball | |
| 6,995,468 B2 | 2/2006 | Abe et al. | |
| 7,029,931 B2 | 4/2006 | Cobbley et al. | |
| 7,037,756 B1 | 5/2006 | Jiang et al. | |
| 7,109,059 B2 | 9/2006 | Wark | |
| 7,166,495 B2 | 1/2007 | Ball | |
| 7,186,576 B2 | 3/2007 | Cobbley et al. | |
| 7,217,596 B2 | 5/2007 | Cobbley et al. | |
| 7,371,612 B2 * | 5/2008 | Ball | 438/113 |
| 2001/0005141 A1 | 6/2001 | Pochmuller | |
| 2002/0009828 A1 | 1/2002 | Oppermann et al. | |
| 2002/0042161 A1 | 4/2002 | Sato et al. | |
| 2002/0058357 A1 * | 5/2002 | Chang | 438/118 |
| 2002/0072202 A1 | 6/2002 | Odashima et al. | |
| 2002/0151103 A1 * | 10/2002 | Nakamura et al. | 438/106 |
| 2003/0071340 A1 | 4/2003 | Derderian | 257/686 |
| 2003/0102567 A1 * | 6/2003 | Eskildsen | 257/777 |
| 2003/0122236 A1 * | 7/2003 | Nam et al. | 257/685 |
| 2003/0178715 A1 | 9/2003 | Sturcken et al. | |
| 2003/0189257 A1 * | 10/2003 | Corisis et al. | 257/777 |
| 2005/0029645 A1 * | 2/2005 | Mess et al. | 257/686 |
| 2005/0202595 A1 | 9/2005 | Yonehara et al. | |
| 2006/0071324 A1 * | 4/2006 | Lu et al. | 257/704 |
| 2006/0121645 A1 | 6/2006 | Ball | |

FOREIGN PATENT DOCUMENTS

| | | |
|---|---|---|
| JP | 60010634 | 1/1985 |
| JP | 362048037 | 3/1987 |
| JP | 401108008 | 4/1989 |
| JP | 6255726 | 9/1994 |
| JP | 2002252326 * | 9/2002 |

* cited by examiner

STACKED DIE MODULE INCLUDING MULTIPLE ADHESIVES THAT CURE AT DIFFERENT TEMPERATURES

This application is a divisional of U.S. application Ser. No. 10/141,447, filed May 8, 2002, now U.S. Pat. No. 6,682,955 B2. which issued on Jan. 27, 2004.

BACKGROUND OF THE INVENTION

1. Field of the Invention

The present invention relates generally to semiconductor processing and, more particularly, to a stacked die module and techniques for forming a stacked die module.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Packaging of electrical circuits is a key element in the technological development of systems implementing electrical components. Various techniques have been developed to meet the continued demands for improving system performance and capability. Engineers have been challenged with finding ways to increase hardware capabilities while the space in which to provide these hardware capabilities continues to decrease.

One technique for saving valuable system board geography is to implement die stacking techniques. A standard integrated circuit package, such as a memory or processor package, may include a substrate whereon chips or die may be stacked. Die stacks are generally formed directly on a substrate. A first die may be adhesively and/or electrically coupled to the substrate. A second die may then be stacked on top of the first die and adhesively and/or electrically coupled to the first die. In addition or alternatively, the second die may be electrically coupled directly to the substrate by bondwires or leads, for example, or electrically coupled to the substrate through the first die. A third die may then be attached to the second die, and so forth.

While current stacking techniques provide more hardware capability in smaller areas by eliminating the need to populate additional substrate surface area for each individual die used in the system, the present techniques have several disadvantages. One problem is that the die are becoming extremely thin (1-6 mil). While thinner die have some advantages, the thinner die are more difficult to handle with the current die stacking tools. Stacking a die onto a substrate and then stacking a number of die one on top of the other, often involves numerous iterations using various tools and instruments which creates a number of handling iterations which may result in damage to one or more of the die in the stack. Further, the substrates on which the die are stacked generally have a different coefficients of thermal expansion. Thus, once the stack is formed on the substrate and cured, as in typical die stacking systems, a mismatch in the coefficients of thermal expansion (CTEs) may be introduced, which may cause cracking or other problems with the die stack since the interface between each of the die and the interface between the die and substrate are being cured at the same time but have different CTEs. Further, the processing difficulties may result in the wasting of previously good substrates since the die may be damaged in the die stacking process but this damage may not be realized until the entire package is assembled and electrically tested, as is the case in typical systems.

The present invention may address one or more of the problems set forth above.

BRIEF DESCRIPTION OF THE DRAWINGS

Certain advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
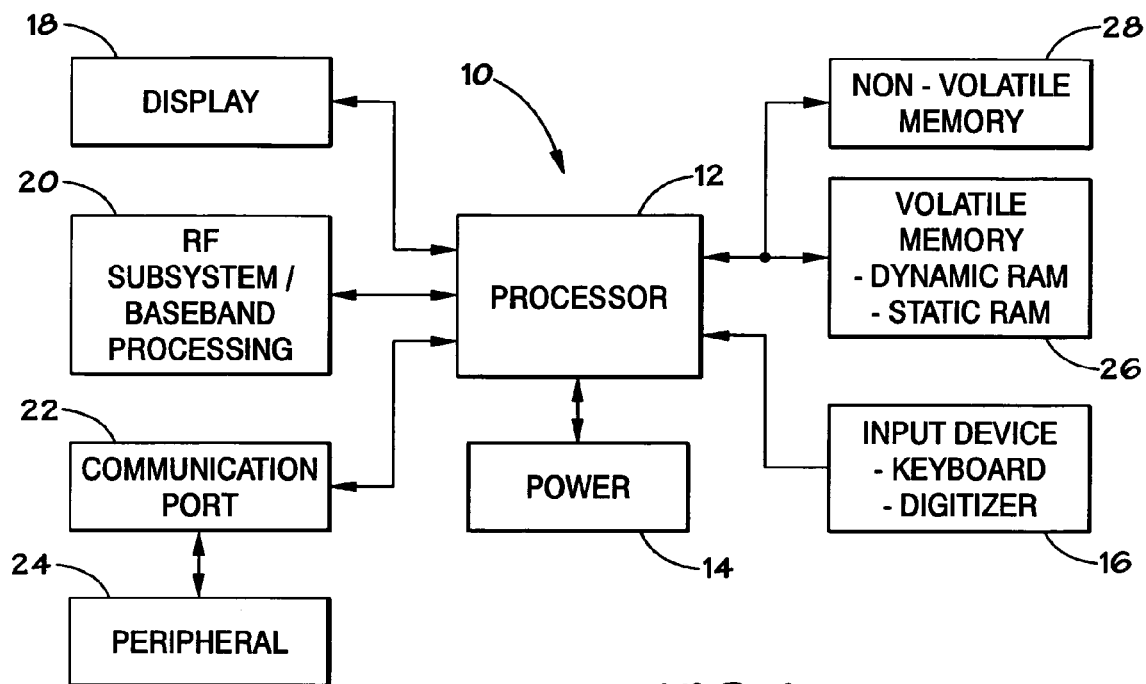
FIG. 1 illustrates a block diagram of an exemplary processor-based system.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a signal processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Figure 2:
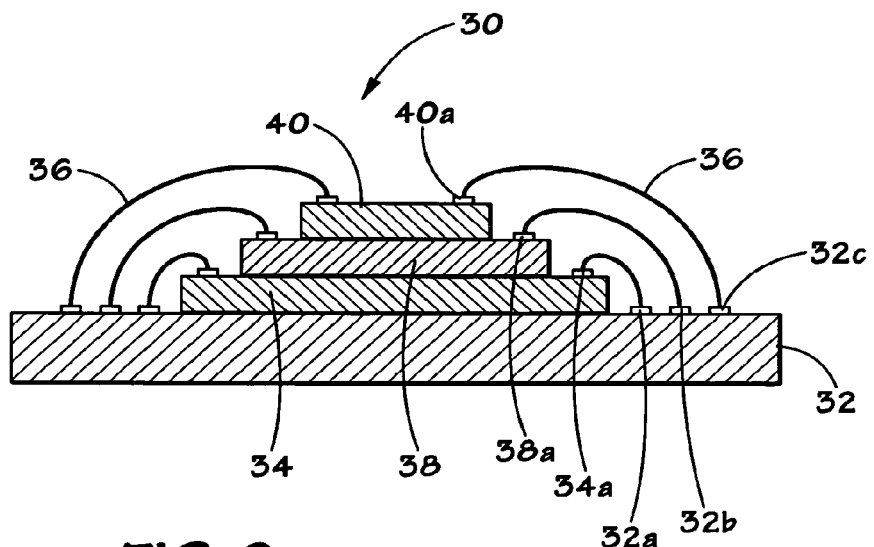
FIG. 2 illustrates an exemplary package incorporating wirebond technology in accordance with the present techniques.

FIG. 2 illustrates a cross-section of an exemplary die package implementing bondwire technology, generally designated by reference numeral 30, which may be incorporated in the system 10. The package 30 may comprise memory die such that the package 30 may be incorporated in the volatile memory 26, for example. The package 30 generally includes a substrate 32. Die, such as memory die, may be stacked on the substrate 32. For instance, a first die 34 may be adhesively coupled to the substrate 32 by a paste or epoxy, for example. The first die 34 may include bond pads 34*a* such that the first die 34 may be electrically coupled to the pads 32*a* on the substrate via bondwires 36. A second die 38 may be stacked on and adhesively coupled to the first die 34 by a paste or epoxy, for example. The second die 38 may include bond pads 38*a* such that the second die 38 may be electrically coupled to the pads 32*b* on the substrate via bondwires 36. The second die 38 may have a smaller topside surface area than the first die 34 and the entire perimeter of the second die 38 may be contained entirely within the perimeter of the first die 34. This exemplary aspect will be explained further below with reference to FIGS. 4 and 5. A third die 40 may be stacked on and adhesively coupled to the second die 38 by a paste or epoxy, for example. The third die 40 may include bond pads 40*a* such that the third die 40 may be electrically coupled to the pads 32*c* on the substrate via bondwires 36. The third die 40 may have a smaller topside surface area than the second die 38 and the entire perimeter of the third die 40 may be contained entirely within the perimeter of the second die 38. It should be noted that while the exemplary die stack illustrated in FIG. 2 includes three die, the die stack may include greater or fewer die.

Figure 3:
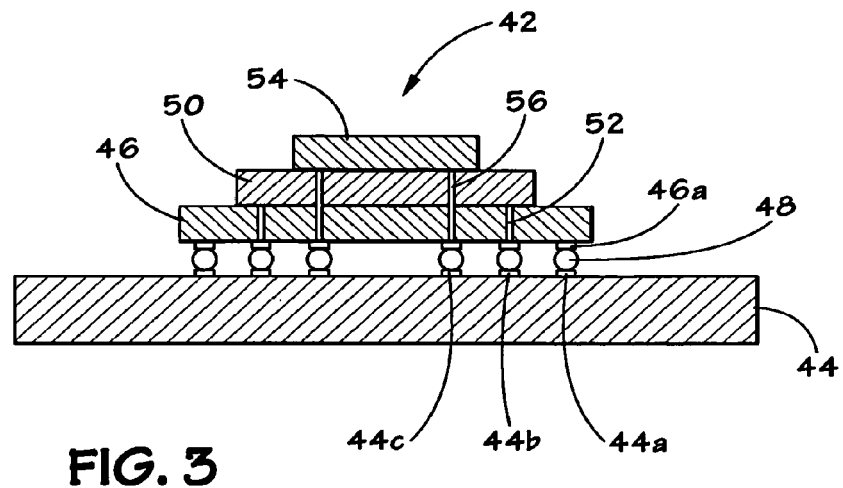
FIG. 3 illustrates an exemplary package incorporating ball grid array technology in accordance with the present techniques.

FIG. 3 illustrates a cross-section of an exemplary die package implementing ball grid array (BGA) technology, generally designated by reference numeral 42, which may be incorporated in the system 10. The package 42 may, for example, comprise memory die such that the package 42 may be incorporated in the volatile memory 26. The package 42 generally includes a substrate 44. A first die 46, such as a memory die, may be adhesively and electrically coupled to the substrate 44 by conductive balls 48, such as solder balls for example. The first die 46 may include bond pads 46*a* such that the first die 46 may be electrically coupled to the pads 44*a* on the substrate via the conductive balls 48. A second die 50 may be stacked on and adhesively coupled to the first die 46 by a paste or epoxy, for example. The second die 50 may include conductive pads (not shown) such that the second die 50 may be electrically coupled to the pads 44*b* on the substrate through vias and/or conductive paths 52 in the first die 46 and conductive balls 48. The conductive paths 52 include ball pads on the underside of the first die 46. The second die 50 may have a smaller surface area than the first die 46 and the entire perimeter of the second die 50 may be contained entirely within the perimeter of the first die 46. A third die 54 may be stacked on and adhesively coupled to the second die 50 by a paste or epoxy, for example. The third die 54 may include conductive pads (not shown) such that the third die 54 may be electrically coupled to the pads 44*c* on the substrate through vias and/or conductive paths 56 in the second die 50 and the first die 46 and conductive balls 48. The third die 54 may have a smaller surface area than the second die 50 and the entire perimeter of the third die 54 may be contained entirely within the perimeter of the second die 50. It should be noted that while the exemplary die stack illustrated in FIG. 3 includes three die, the die stack may include greater or fewer die.

Generally, stacked die packages, such as those illustrated in FIGS. 2 and 3, are built from the surface of the substrate upward. That is to say that first, a substrate is generally provided. Second, a first die is stacked on top of the substrate and adhesively attached to the substrate. Next, a second die is stacked on top of the first die and adhesively attached to the first die. Next, a third die is stacked on top of the second die and adhesively attached to the second die, and so forth. Finally, the stacked die package is cured to set the adhesive used to form the stacked package.

As previously discussed, several problems exist with the prior design techniques. First, curing a stacked die package which includes a substrate may create stress damage due to the coefficient of thermal expansion (CTE) mismatch between the die and substrate. Second, stacking die from the surface of the substrate means increased package handling since multiple iterations are typically required to stack the die on the substrate using a die attach machine. Die stacking equipment may be costly, slow and inaccurate. Third, with chip design yielding increasingly thinner die, excess handling of individual die in the conventional stacking process may increase the likelihood of damage to the die. Not only does die damage during the stacking process disadvantageously waste the damaged die, but the damaged die may be unknowingly incorporated into a stacked package thereby causing the entire package to be scrapped eventually.

Figures 4A, 4B, 4C:
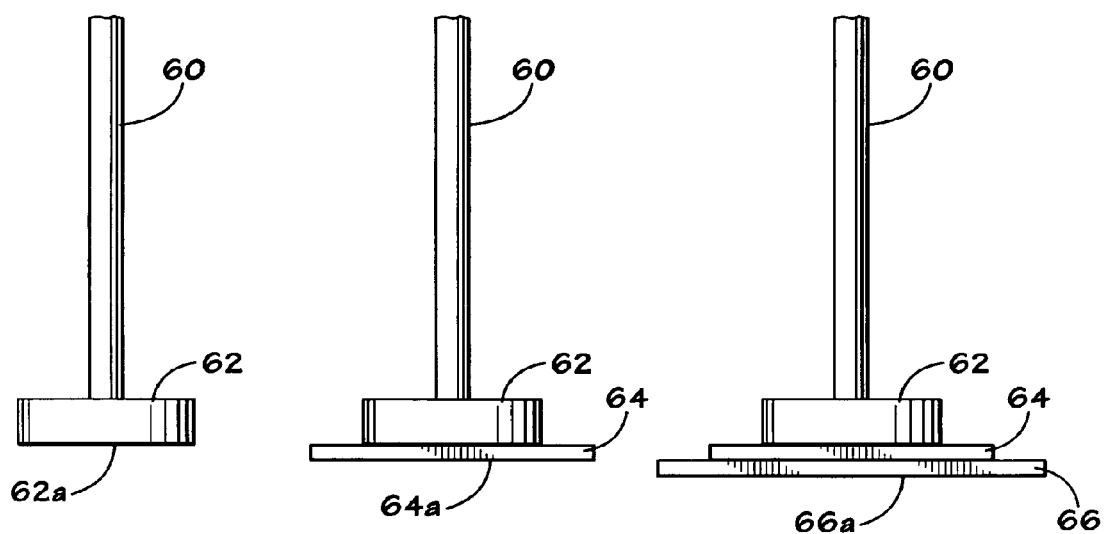
FIGS. 4A-C illustrate a top down die stacking method in accordance with the present techniques.

FIGS. 4A-4C illustrate a die stacking technique which may address some or all of the problems described above. Generally, a stacking tip 60 is used to facilitate a top-down stacking technique. The stacking tip 60 may be connected to a vacuum or suction hose (not shown), for example, to provide enough suction to lift one or more die securely. FIG. 4A illustrates the stacking tip 60 after it has lifted a first die 62. The first die may advantageously include a layer of adhesive, such as paste or epoxy, on the underside 62*a*. Alternately, the stacking tip 60 may be used to facilitate the dipping, brushing or spraying, for example, of the underside 62*a* of the first die 60 with an adhesive after the first die 62 is lifted by the stacking tip 60.

FIG. 4B illustrates the stacking tip 60 after it has lifted a second die 64. The stacking tip 60 may be manually or automatically directed to the second die 64. Regardless of the mechanism, by placing the underside 62*a* of the first die 62 in contact with the second die 64, the second die 64 is adhesively coupled to the first die 62, thereby creating a stack of two die. As illustrated in the exemplary embodiment, the first die 62 may be thicker than the second die 64. The first die 62 may, for example, have a thickness of 6-10 mils, while the second die 64 may have a thickness of 1-6 mils. In some applications, it may be advantageous to implement a thick first die 62 to act as a stiffener for the die stack. The thicker die may enhance the overall durability of the die stack as well as provide structural support during the die stacking process. However, in some applications, it may not be necessary or desirable to use die of varying thicknesses.

Also, in the exemplary embodiment, the surface area of the first die 62 may be smaller than the surface area of the second die 64, and the first die 62 may be attached to the second die 64 such that the entire perimeter of the first die 62 is contained within the perimeter of the second die 64. This aspect of this exemplary embodiment will be further explained below with reference to FIG. 5A. Finally, the second die may advantageously include a layer of adhesive, such as paste or epoxy, on the underside 64a to facilitate the adhesive attachment to a third die. Alternately, the stack may only include the first die 62 and the second die 64.

FIG. 4C illustrates the stacking tip 60 after it has lifted a third die 66. The stacking tip 60 may be manually or automatically directed to the third die 66. Regardless of the mechanism, by placing the underside 64a of the second die 64 in contact with the third die 66, the third die 66 is adhesively coupled to the second die 64, thereby creating a stack of three die. If the die stack includes more than three die, the underside 66a of the third die 66 may be coated with an adhesive to facilitate further die stacking. The process may be repeated a number of times depending on the number of die in the stack. The bottom die in the stack (here the third die 66) may not include an adhesive on the underside if further stacking is not desired.

Once the die stack is formed, the completed die stack may be deposited on a temporary holding surface such as a film frame, gel pack, tape reel, JEDEC tray, etc., for later attachment onto a substrate. Further, before the die stack is attached to the substrate, the die stack may be cured at a high temperature, in the range of 50-400° C., for example. Still further, prior to attachment to a substrate or even prior to attachment to the temporary holding surface, the die may be tested to ensure that all die in the stack are functional, thus forming a known good die stack (KGDS). The adhesive used to attach each die together may be different than the adhesive which may be used later to attach the die stack to the substrate. Once the die stack is coupled to a substrate using a second adhesive, the package may again be cured. However, by varying the adhesive material, differences in the coefficients of thermal expansion (CTEs) can be considered. Advantageously, the temperature used to cure the second adhesive may be lower, thereby minimizing the effects of the CTE mismatch. For example, the second adhesive may be cured in the temperature range of 50-100° C., for example.

Alternatively, the temporary holding surface may be a die wafer, wherein the die stack is deposited on top of a known good die which is still in wafer form. The known good die on which the die stack is deposited may be adhesively attached to the die stack by an adhesive on the exposed underside of the die stack, as previously described, and the known good die will form the bottom die of the die stack. The holding surface is considered temporary in that the wafer itself may be used to temporarily hold, transfer, test or store one or more die stacks for example. The wafer may be uncut or cut. If the wafer is cut, it may include an adhesive backing, such as a tape, which holds the die in wafer form until the stacks are separated for curing, testing and/or attachment to a substrate. Each of the wafers is excised but may be held together by a tape backing, for instance, such that the individual die, preferably the known good die, can be lifted from the tape. If the wafer is uncut, the wafer will then be cut or otherwise separated prior to incorporation of the excised die stacks into packages. Stacks may be assembled across an entire wafer. Once the wafer is cut, the cut wafer with die stacks may be loaded into conventional die attach equipment for attachment to a substrate.

One advantage of the technique of forming the entire stack prior to attaching it to the substrate is that the entire die stack is attached to the substrate with one motion thereby reducing the number of iterations as compared to the typical method of forming die stacks directly on the substrate. As previously described, the prior stacking techniques may necessitate several iterations in the building of the die stacks directly on the substrate.

Figure 5D:
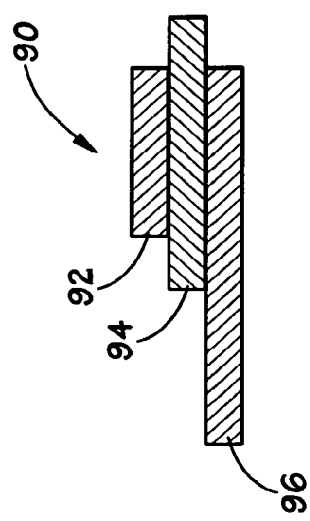
FIGS. 5A-D illustrate exemplary embodiments of die stacks in accordance with the present techniques.
Figure 5C:
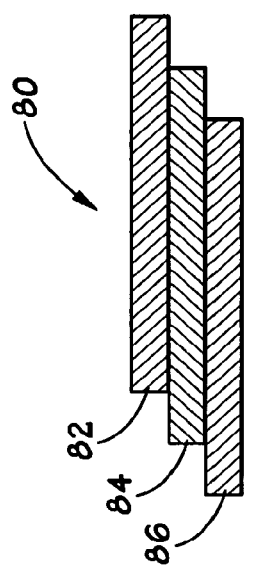
Figure 5B:
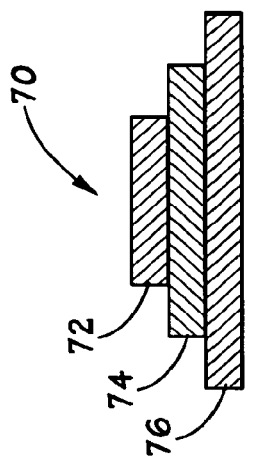
Figure 5A:
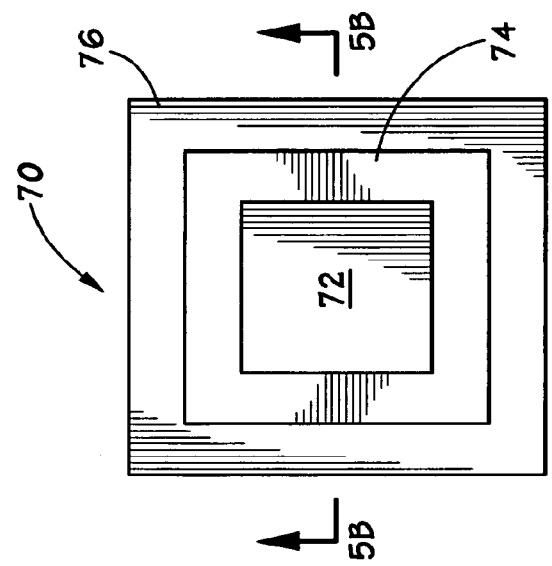

FIG. 5A illustrates a top plan view of an exemplary die stack 70. A cross section of the die stack 70 taken along the line A-A is illustrated in FIG. 5B. The die stack 70 includes a first die 72, a second die 74, and a third die 76. In the exemplary embodiment, each of the die in the die stack 70 has approximately the same thickness, as illustrated in FIG. 5B. However, as discussed above, it may be advantageous to use die of varying thicknesses. The first die 72 has a smaller topside surface area than the second die 74, and the second die 74 has a smaller topside surface area than the third die 76, as illustrated in FIG. 5A. Further, the die stack is configured such that the first die 72 is substantially centered within the perimeter of the second die 74, and the second die 74 is substantially centered within the perimeter of the third die 76.

Alternately, the die stacks may be constructed in alternate configurations, such as those illustrated in FIGS. 5C and 5D. FIGS. 5C and 5D are cross-sectional views of "shingle stacks." Shingle stacks are die stacks wherein upper die may overhang die below them in the stack such that their centers are not aligned. FIG. 5C illustrates one embodiment of a shingle stack 80. The shingle stack 80 includes a first die 82, a second die 84, and a third die 86. As can be seen, the second die 84 has been attached to the third die 86 such that the edge of the second die 84 overhangs the edge of the third die 86 and the center of the second die 84 does not line up with the center of the third die 86. Likewise, the first die 82 is attached to the second die 84 such that the edge of the first die 82 overhangs the edge of the second die 84 and the center of the first die 82 does not line up with the center of the second die 84. The exemplary embodiment illustrated in FIG. 5C incorporates die of the same size and thickness with respect to one another.

FIG. 5D illustrates an alternate embodiment of a shingle stack 90. The shingle stack 90 includes a first die 92, a second die 94 and a third die 96. As can be seen, the second die 94 has been attached to the third die 96 such that the edge of the second die 94 overhangs the edge of the third die 96. The first die 92 is attached to the second die 94 such that the edge of the first die 92 is relatively even with the edge of the third die 96. The exemplary embodiment illustrated in FIG. 5D incorporates die of the same thickness with respect to one another but differing in size. Thus, the embodiment illustrated in FIG. 5D can be viewed as a hybrid of the embodiments illustrated in FIGS. 5B and 5C. Various configurations and dimensions of die and die stacks may be advantageous in various applications and may be implemented in accordance with the present techniques.

Figure 6:
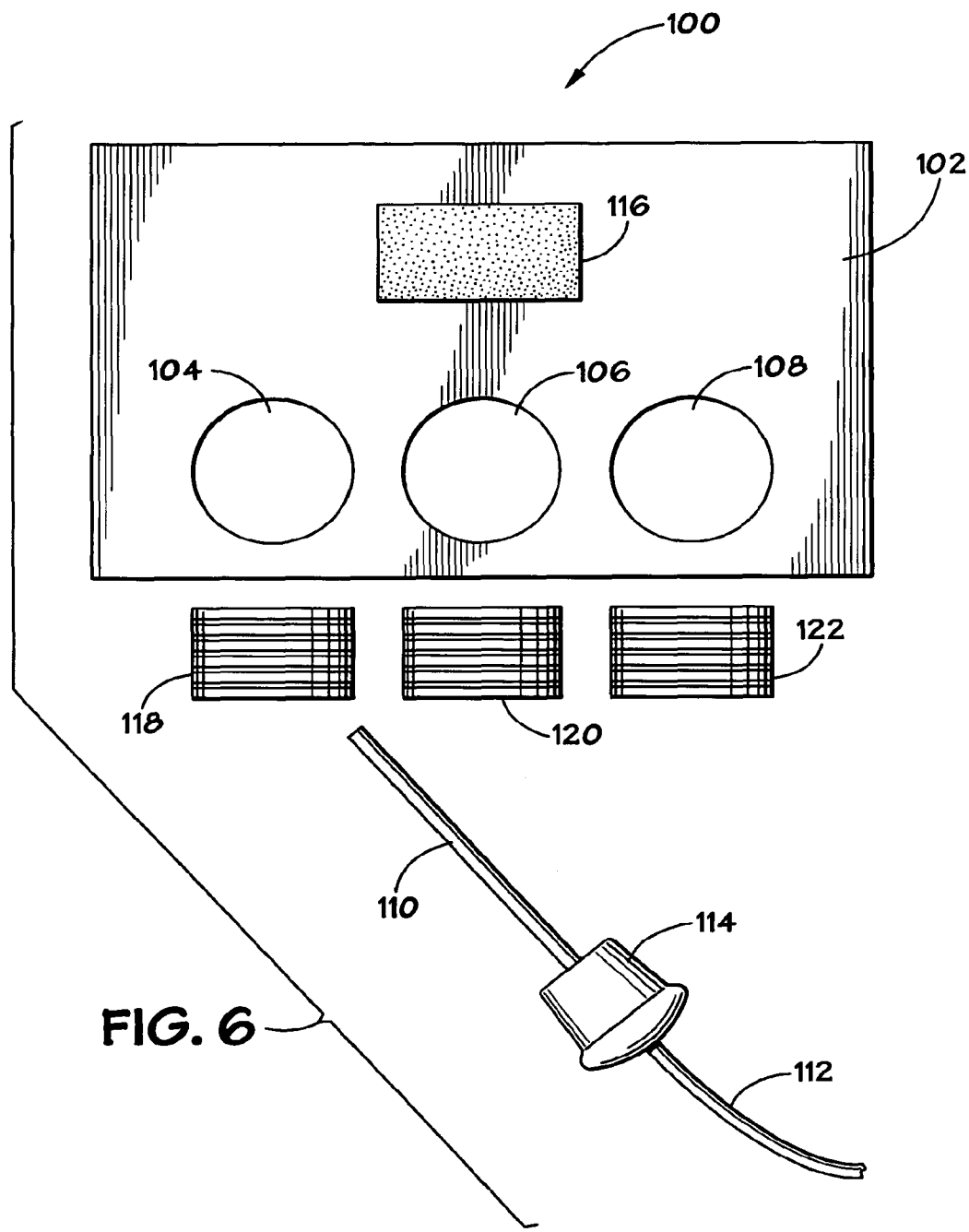
FIG. 6 illustrates an exemplary stacking system in accordance with the present techniques.

FIG. 6 illustrates a block diagram of an exemplary assembly system 100 in accordance with the present techniques.

The system 100 may include an assembly table 102 on which the pre-stacked die may be disposed. In the present embodiment, each of the die which will be used to build a die stack are contained within one of a first wafer 104, a second wafer 106, and a third wafer 108. Each of the wafers is excised but may be held together by a tape backing, for instance, such that the individual die, preferably the known good die, can be lifted from the tape by the stacking tip 110. Alternatively, three containers or die packs containing excised die may be placed on the assembly table 102 in place of the wafers. As previously discussed, the stacking tip 110 may be attached to a vacuum hose 112 to provide a suction at the end of the stacking tip 110 to facilitate the lifting of one or more die. The suction provided through the stacking tip 110 is advantageously at such a strength as to facilitate the separation of the individual die from their corresponding wafers 104, 106 and 108 (or containers) and to lift the die (or plurality of stacked die) which will be used to form the die stack. Although this process is typically automated, the stacking tip 110 may include a gripping structure 114 to facilitate manual operation of the stacking tip 110.

As previously described, a first die may be lifted from the first wafer 104 using the stacking tip 110. The die from the first wafer 104 ("first die") may have an adhesive coating on the underside of the die or may be coated with an adhesive after the first die is removed from the first wafer 104. Next, the stacking tip 110 is used to manipulate the first die on top of a die on the second wafer 106 ("second die"). The adhesive on the underside of the first die will facilitate the coupling of the first die to the second die as the first die is pressed against the second die. The stack, including the first and second die, is lifted from the second wafer 106. The second die may have an adhesive coating on the underside of the die or may be coated with an adhesive after the second die is removed from the second wafer 106. Next, the stacking tip 100 is used to manipulate the stack (including the first and second die) on top of a die on the third wafer 108 ("third die"). The adhesive on the underside of the second die will facilitate the coupling of the second die to the third die as the stack is pressed against the third die. The die stack may then be lifted and disposed on a temporary holding surface 116, such as a gel pack, film frame, etc. to await further processing.

The aforementioned process may be repeated until one of the wafers 104, 106 or 108 has been depleted of its die supply. At that point, another wafer may be removed from a respective wafer tray 118, 120 or 122 and placed on the assembly table 102 for continued stack assembly. It should be noted that the thickness and dimensions of each of the corresponding wafers 104, 106 and 108 may vary as previously described with references to FIGS. 4 and 5. Further, as described with reference to FIG. 5, the stacking configuration may vary depending on system requirements or user preferences.

An alternative to the top-down stacking technique described above is to stack the die from the bottom-up. The die may be stacked on a temporary holding surface such as a gel pack, film frame, tape reel etc., or a wafer wherein the known good die on the wafer are used as the bottom die in the stacks. In the latter embodiment, the die stacks are formed directly on the known good die on the wafer. A stacking tip may be used to stack the die on the wafer or other temporary holding surface.

Regardless of whether the die stacks are formed by a top-down technique or alternately by a bottom-up technique, one of the advantages of the present system is the formation of the die stack without a substrate. Advantageously, by forming a die stack without attaching the die stack to a substrate, the stack can be assembled using a first adhesive and cured at a different temperature than the adhesive later used to attach the die stack to a substrate, as discussed above. Further, the die stack can be electrically tested prior to attachment to a substrate. By identifying bad die stacks before attaching them to a substrate, unnecessary scrapping of good substrates may be avoided. Still further, the die stack can be mechanically and structurally tested for functionality and/or reliability. Advantageously, functional testing can be used to screen die stacks before they are attached to a corresponding substrate. Faulty die stacks can be identified and scrapped prior to substrate attachment. Typical environmental and structural testing may include thermal cycling, temperature cycling, autoclave, vibration testing, etc. By assembling the die stacks without prior attachment to a corresponding substrate, various reliability data can be gathered and failure mechanisms can be identified on the die stacks which may improve future design iterations, as well as prevent early failure of packages which have been incorporated into systems, such as the system 10. After desired testing, the die stacks may be attached to a substrate to form a package, such as those illustrated with reference to FIGS. 2 and 3.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit comprising:
   a stack comprising at least two semiconductor die, each of the semiconductor die being coupled together by a first adhesive, the first adhesive being curable at a first temperature; and
   a substrate coupled to one of the at least two semiconductor die by a second adhesive, the second adhesive being curable at a second temperature lower than the first temperature.

2. The integrated circuit, as set forth in claim 1, wherein the topside surface area of one of the at least two semiconductor die is less than the topside surface area of a second of the at least two semiconductor die.

3. An integrated circuit comprising:
   a stack comprising at least two semiconductor die, each of the semiconductor die being coupled together by a first adhesive, the first adhesive being curable at a first temperature; and
   a substrate coupled to one of the at least two semiconductor die by a second adhesive, the second adhesive being curable at a second temperature lower than the first temperature;
   wherein the stack of at least two semiconductor die is configured such that the stack comprises a shingle stack.

4. The integrated circuit, as set forth in claim 1, wherein at least one of the at least two semiconductor die comprises a memory die.

5. An integrated circuit comprising:
   a stack comprising at least two semiconductor die, each of the semiconductor die being coupled together by a first adhesive, the first adhesive being curable at a first temperature; and
   a substrate coupled to one of the at least two semiconductor die by a second adhesive, the second adhesive being curable at a second temperature lower than the first temperature;

wherein each die in the stack of at least two die is successively thinner than the previous die as the die approach the substrate.

6. An integrated circuit comprising:

a stack of at least two semiconductor die, each of the die being coupled to an adjacent die in the stack by a respective layer of a first adhesive prior to the stack being coupled to a packaging substrate, wherein the first adhesive is curable at a first temperature; and a second adhesive disposed on an outer side of the stack to facilitate coupling the stack with the packaging substrate, wherein the second adhesive is curable at a second temperature lower than the first temperature.

7. The integrated circuit, as set forth in claim 6, wherein the topside surface area of one of the at least two semiconductor die is less than the topside surface area of a second of the at least two semiconductor die.

8. The integrated circuit, as set forth in claim 6, wherein at least one of the at least two semiconductor die comprises a memory die.

9. An integrated circuit package comprising:

a substrate; and a die stack coupled to the substrate, wherein the die stack comprises at least two semiconductor die coupled together via a first adhesive that is curable at a first temperature and has been cured; and a second adhesive disposed between the die stack and the substrate that is curable at a second temperature lower than the first temperature.

10. The integrated circuit package, as set forth in claim 9, wherein at least one of the at least two semiconductor die comprises a memory die.

* * * * *